United States Patent [19]

Belmonte et al.

[11] 3,997,764
[45] Dec. 14, 1976

[54] METHOD FOR THE CONVERSION OF A FREQUENCY INTO A NUMBER

[75] Inventors: Jean-Claude Belmonte, Echirolles; Jean-Jacques Hirsch, Claix; Pierre Rassat, Grenoble, all of France

[73] Assignee: Societe Generale de Constructions Electriques et Mecaniques, France

[22] Filed: Aug. 23, 1974

[21] Appl. No.: 499,906

[30] Foreign Application Priority Data

Aug. 23, 1973 France .......................... 73.30558

[52] U.S. Cl. .................... 235/92 FQ; 235/92 CA; 235/92 R; 324/78 D; 340/347 AD
[51] Int. Cl.[2] ........................................ H03K 21/10
[58] Field of Search ...... 235/92 FQ, 92 TF, 92 CA, 235/92 EV, 180, 181, 197; 324/79 D, 78 D; 340/146.2, 347 AD

[56] References Cited

UNITED STATES PATENTS

| | | | |
|---|---|---|---|
| 2,951,202 | 8/1960 | Gordon | 324/79 D |
| 3,112,478 | 11/1968 | Ostroff | 324/78 D |
| 3,636,336 | 1/1972 | Everett et al. | 235/92 EV |
| 3,651,414 | 3/1972 | Jamieson | 235/92 EV |
| 3,673,391 | 6/1972 | Lougheed | 235/92 EV |
| 3,820,021 | 6/1974 | Clarisse | 324/79 D |
| 3,835,452 | 9/1974 | Zirphile | 340/146.2 |

*Primary Examiner*—Gareth D. Shaw
*Assistant Examiner*—John P. Vandenburg
*Attorney, Agent, or Firm*—Craig & Antonelli

[57] ABSTRACT

Method for the conversion of a frequency into a number, characterized in that use is made of a reversible counter driven by a logic control circuit receiving clock pulses and a frequential input signal formed by pulses having a period of $a$ in addition to a stochastic feedback signal representing the required number, where the required number is a number which depends on the frequency of the input signal and is generated by this method. The logic control circuit makes the counter count up the clock pulses during the time periods $a$ and makes it count down the pulses of the stochastic signal during all other times. The stochastic signal stored in the reversible counter represents a number which depends on the frequency of the frequential input signal being sampled.

12 Claims, 9 Drawing Figures

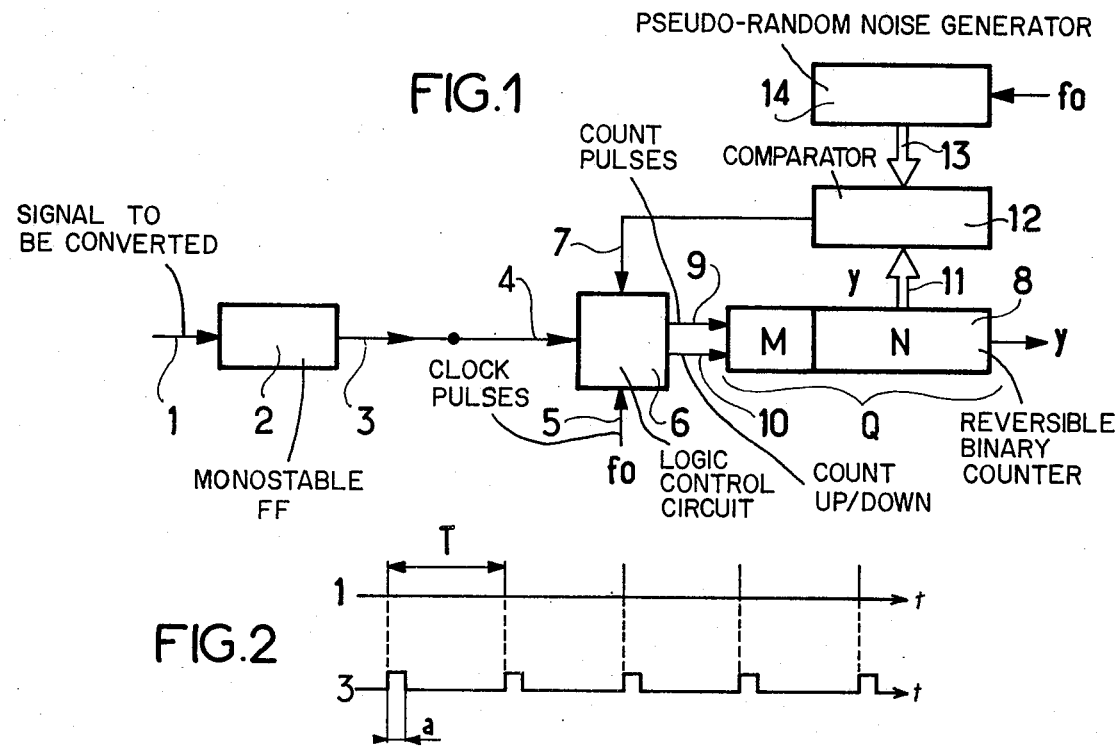
FIG.1
FIG.2
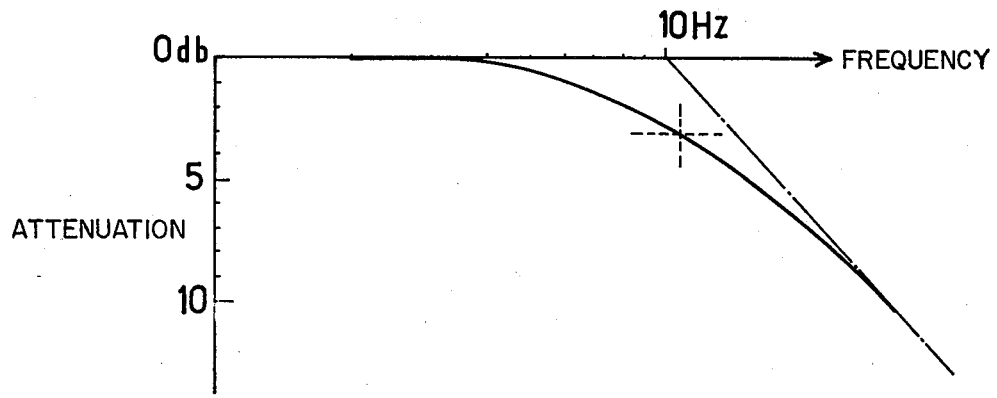
FIG.3

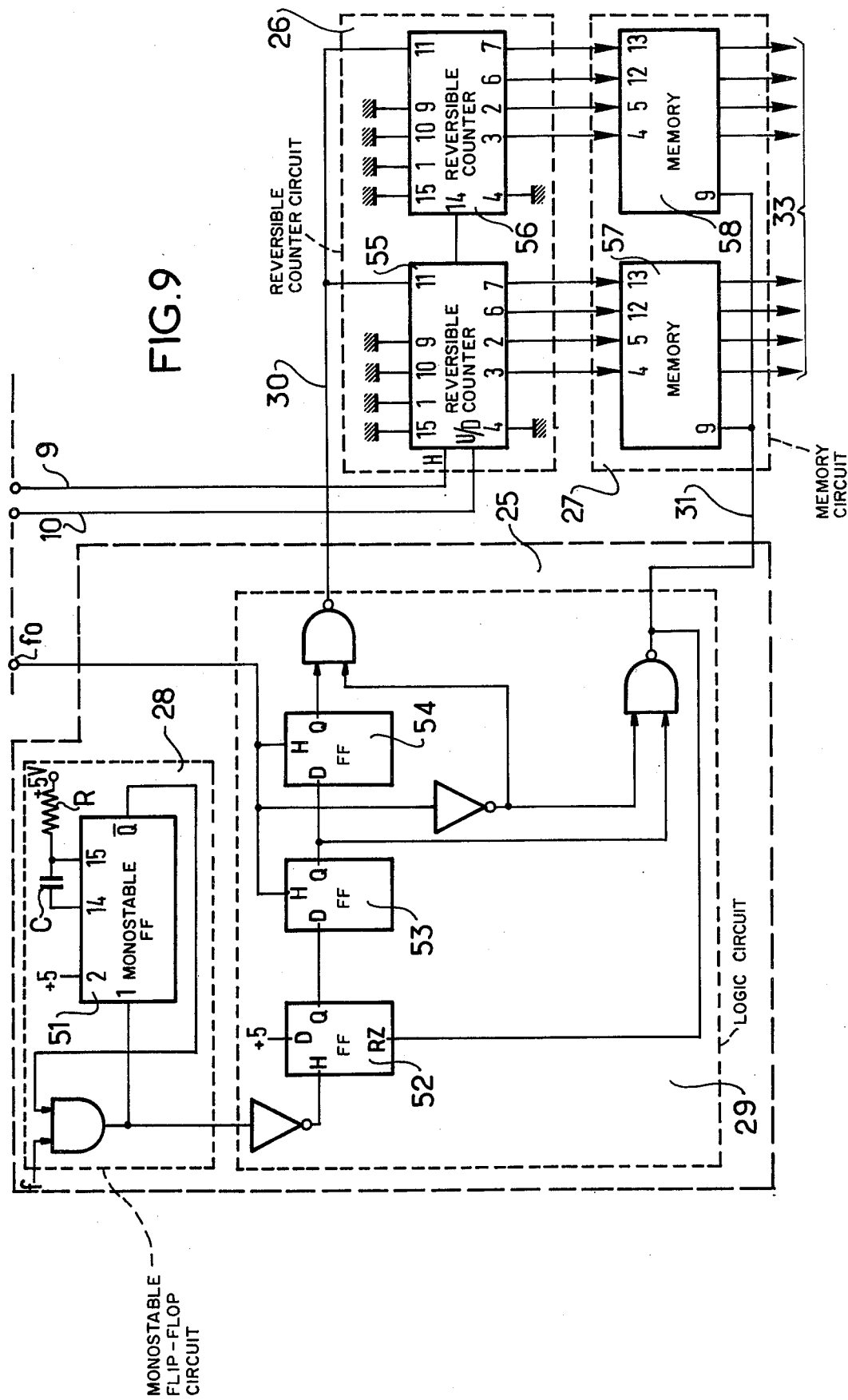

METHOD FOR THE CONVERSION OF A FREQUENCY INTO A NUMBER

Data are often made available in the form of a frequency as in the case of the measurement with the measuring of the angular speed of a mechanical element (rotor, wheel, etc...) by means of a transducer supplying pulses at a frequency proportional to the speed to be measured.

Since the processing of the data in analog form lacks accuracy and stability and requires adjustments, it is preferred to have the data available in digital form. However, presently known methods for transforming a frequency into a number are complicated and do not make it possible to simultaneously have a sufficient pass band in addition to covering a wide range of frequencies.

It is possible, for example, to measure directly the frequency, by counting, during a constant time period, the pulses defining that frequency, but continuous data is not obtained and, to cover a wide range of frequencies, a binary counter with a great number of bits must be used which necessitates a long counting time.

It is also possible to count, between two pulses defining the frequency of an input signal, the pulses of a standard high-frequency clock; the contents of the counter is then proportional to the period of the input signal and, to have a number proportional to the frequency, the reciprocal of the number representing the period must be taken, this not being an easy operation to carry out. Moreover, to maintain a sufficient accuracy in the high-frequency range, a very high frequency standard clock must be used; moreover, the measurement time period is long in the low-frequency range.

The invention is intended to effect the conversion of a frequential input signal into a number, by simple means enabling a wide pass band to be obtained and a wide frequency range to be covered.

It has been found, according to the present invention, that it is possible tp obtain the required result by means of a method characterized in that at least one first reversible counter is used, with a first logic control circuit, having a clock pulse input, used to drive the counter. The frequential input signal is in the form of a series of pulses each having the same time duration $a$. A first stochastic signal representing the coding in a stochastic representation form of a number representing the frequency of the input signal is obtained subsequent to the said first reversible counter. The first logic control circuit is used to make the reversible counter count up the clock pulses during the periods $a$ and count down at all other time s the pulses of the first stochastic signal. A number depending on the frequency of the input signal is sampled using the last stages of the first reversible counter, with the first stages of that counter acting as buffer stages.

The first stochastic signal, more particularly, consists of the contents, coded in a stochastic representation, form of the last stages of the first reversible counter.

The required number, generated by this method, may be sampled from these last stages of the first reversible counter and no other reversible counter need be used.

It is also possible to arrange a second reversible counter in cascade with the first reversible counter, as will be explained further on.

The diagrammatic drawings herewith will make it possible to explain the operation of the method and to specify certain developments thereof.

FIG. 1 illustrates a circuit for the conversion of a frequential signal into a digital signal.

FIG. 2 shows the input signals in that circuit.

FIG. 3 is a diagram showing a dynamic characteristic of a circuit according to FIG. 1.

FIG. 9 shows a technological embodiment of the diagram in FIG. 7.

Figure 4:
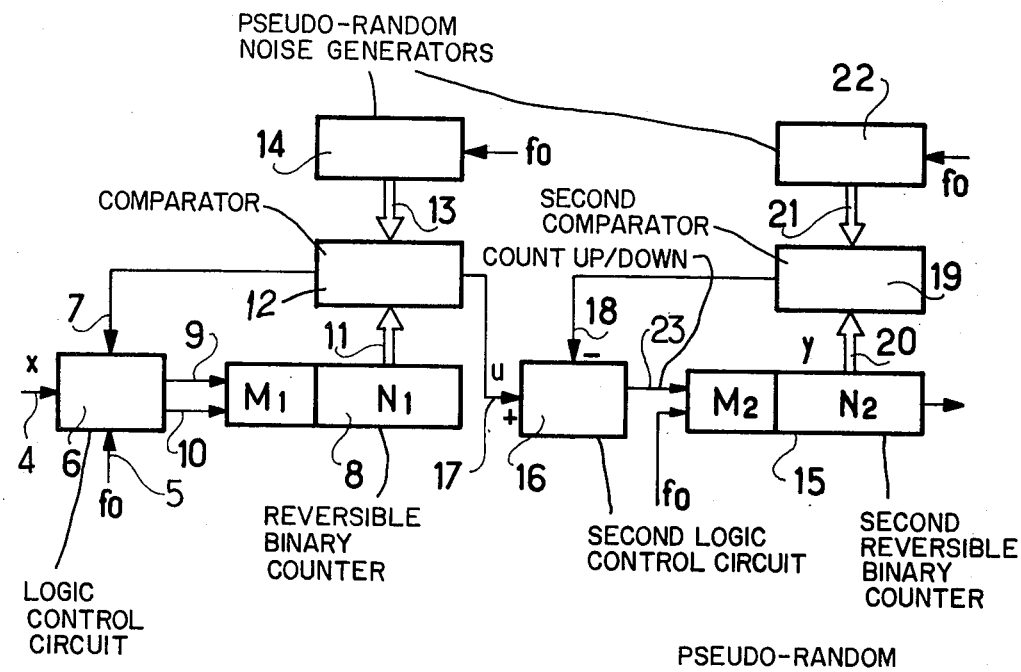
FIGS. 4 and 5 show conversion circuits giving a transfer function of the second order.

In FIG. 1, the signal to be converted arrives at 1, (the input of monostable flip-flop 2), in the form of a series of short pulses as shown in the upper waveform of FIG. 2, having a period of T and a frequency of f. These pulses are transformed at the output 3 of monostable flip-flop 2 into a series of pulses each having a duration $a$ as shown in the lower waveform of FIG. 2. The signal obtained at 3 is used as one of the inputs of the logic control circuit 6 also circuit also receives at input 5, clock pulses having the frequency $f_0$ and, at input 7 receives a stochastic signal. The logic control circuit transmits to the input 9 of reversible binary counter 8, having Q stages, the pulses to be counted up or down transmits to input 10 the control signal used to control the direction of counting of the reversible counter. The contents of the N last stages of the Q stages of counter 8 is transmitted by the connection 11 to comparator 12 receiving at input 13 the noise output in parallel digital form supplied by pseudorandom noise generator 14, which may comprise, for example, a multibit shift register driven at a clock frequency $f_0$. The output 7 of the comparator 12 is a stochastic signal which is the coding in a stochastic representation form of the contents of the N last stages of the counter 8.

The frequency $f_S$ of the stochastic output signal 7 of the comparator 12 is such that: $f_S = f_0 \, y/2^N$, $y$ being the contents of the N last stages of the counter 8.

The logic control circuit 6 makes the counter 8 count clock pulses at the frequency $f_0$ when the output 3 of monostable 2 is in the high state, (that is, during the time periods $a$), and it makes counter 8 count down at all others times the pulses of the stochastic signal 7 at a frequency of $f_S$ supplied by comparator 12.

Assuming that the system is balanced, (that is, the number of pulses counted up by counter 8 is equal to the number of pulses counted down by counter 8, during a time period T of the input signal,) then the following result is obtained:

$$a.f_0 = T f_S$$

or $$a.f_0 = T f_0 \, y/2^N$$

Thus: $y/2^N = a/T$ or: $y/2^N = a.f$, i.e., the contents of the N last stages of counter 8 is effectively proportional to the frequency of the input signal. The contents of the N last stages therefore constitute the required number.

It must be understood that the time period $a$ must be less than or equal to the smallest time period T which may be found.

For the balance of the system to exist, counter 8 must be able to absorb the maximum number of pulses which may be counted up or down at a given moment, without any substantial modification of the contents coded in a stochastic representation form in the counter; that is why a number N of stages of the counter less than the total number Q of the stages of the counter is coded, the M = Q - N first stages then acting as buffer stages.

The numbers N and M are chosen as follows: N is the number of bits which defines the accuracy with which the number representing the frequency is required to be obtained; designating the number of states of the buffer stages of the counter which is equal to $2^M$ as L, the result obtained should be: $2^M = L \geq n_{max}$, $n_{max}$ being equal to the maximum number of pulses which may be counted up or down for the lowest frequency of f min of the frequencies f to be passed, that is, $n_{max} =$ a.f0 1 y min/$2^N$ = a. f0 (1 - a f min). Now, the time constant $\tau$ of counter 8 is equal to $$\tau = L \cdot 2^N \cdot \frac{1}{f0} \qquad n_{max} \cdot 2^N \cdot \frac{1}{f0}$$

If it is required to obtain $y = 2^N$ for the greatest $f_{max}$ of the frequencies $f$ to be passed, the period $a$ must be equal to $1/f_{max}$.

Neglecting a f min less than before 1, the result of this is:

$$\tau \approx a \, 2^N = \frac{2^N}{f \max}.$$

It is thus seen that the time constant of the system, hence the pass band, depends only on the resolution chosen.

Tests have been made with an input signal whose pulse frequency varied between 40 Hz and 6000 Hz. The contents of the counter 8 coded according to the stochastic N method, was constituted by eight binary digits, as is the noise received at 13 in comparator 12.

The period $a$ of the pulse input 5 was 150 H and the clock frequency $f_0$ was 1 MHz. As n maxi = 150, if the contents coded in a stochastic representation form in counter 8 were not to be modified by the maximum number n max of pulses to be counted up or down then it would have been necessary to install eight buffer stages M in that counter. Seven buffer stages M were used, in addition to eight stages N whose contents were coded by the stochastic method, causing slight fluctuations in the number to be coded. The time constant was thus about 32 ms, resulting in a cut off frequency of the circuitry at −3 db of about 5 Hz.

The dynamic characteristics of the circuitry were measured, by sinusoidally modulating the input signal centered at 2000 Hz with a modulation ratio on the order of 1. For practical measuring reasons, a counter having six buffer stages was used, giving rise to a cut off frequency, at −3 db, of about 10 Hz.

The measuring was effected by measuring the output voltage of a digital-to-analog converter connected to the last eight stages of the counter 8. The results are shown in FIG. 3, with the variations in frequency being plotted in the abscissa and the attenuation of the resultant signal obtained therefrom being plotted in the ordinate.

In that circuitry, a transfer function which is that of a filter of the first order is obtained. This result is achieved by means of digital components which are simple to produce and do not require any adjustment. The precision of the time constant of the filtering depends only on the stability of the oscillator whose frequency is $f_0$ used for generating the noise and for the overall operation of the circuitry.

It is possible, using the same fluctuation ratio of the output signal, to improve the pass band of the system by means of a circuit whose transfer function is that of a filter of the second order.

FIG. 4 shows such a circuitry circuit containing the circuitry found in FIG. 1, with a counter 8 having $Q_1$ stages, $M_1$ of these being buffer stages and $N_1$ of them being coded in a stochastic representation form, to which has been added a second reversible binary counter 15 receiving clock pulses at the frequency f0 and comprising $Q_2$ stages, $M_2$ of which are buffer stages and $N_2$ of which are coded in a stochastic representation form. The counter is driven by a second logic control circuit 16 which receives at 17 the same stochastic signal as that emitted at 7 by comparator 12 and, at 18 receives a stochastic signal which is the coding, in a stochastic representation form, of the contents of the last $N_2$ stages of counter 15. That coding is effected in a second comparator 19 receiving, at 20, the contents y of the last $N_2$ stages of counter 15 and, at 21, a noise output in perallel digital form produced by a noise generator 22. Instead of the second noise generator 22, the first noise generator 14 could also be used for coding the contents of counter 15.

The logic control circuit 16, (which may comprise a stochastic subtractor or a logic combining circuit of the same type as circuit 6), transmits a control signal at 23 to the counter 15. This signal is the command to count up or down the clock pulses at the frequency $f_0$ and thus increase the number stored in the counter by a number whose average value is equal to $u - y$.

The contents of the counter 15 is number required — an image of the frequency of the input signal.

By designating always by u the signal at 17 and by y the contents of the counter 15, following transfer functions are obtained: $u/x = 1/1 + \tau_1$ P and:

$$y/x = \frac{1}{(1 + \tau_1 p)(1 + \tau_2 p)} = \frac{1}{1 + (\tau_1 + \tau_2)p + \tau_1 \tau_2 p^2}.$$

p being the LAPLACE operator and $\tau_1$ and $\tau_2$ being time constants equal respectively to $2^{Q_1} \cdot T_0$ and $2^{Q_2} \cdot T_0$.

By identifying the transfer function of y/x with the universal transfer function:

$$\frac{1}{1 + 2 z \tau p + \tau^2 p^2}.$$

where z is the damping coefficient and $\tau$ is the equivalent time constant, the conclusion drawn is:

$$\tau = \sqrt{\tau_1 \cdot \tau_2} = 2^{\frac{Q_1 + Q_2}{2}} \cdot T_0 \text{ and}$$

$$z = \frac{1}{2} \frac{\tau_1 + \tau_2}{\sqrt{\tau_1 \cdot \tau_2}} = \frac{2^{Q_1} + 2^{Q_2}}{2 \left( \frac{Q_1 + Q_2}{2} + 1 \right)}.$$

It will be observed that, as for the circuitry shown in FIG. 1, the precision of the overall time constant of the system depends only on the stability of the oscillator whose frequency is $f_0$; moreover, the damping coefficient z is independent of the frequency of that oscillator. Note that the damping coefficient z is an important parameter for a filter of the second order and it is known that great difficulties are encountered in keeping it constant throughout the whole range of temperatures when analog techniques are used, this showing a further advantage of the circuits according to the invention making use of digital techniques.

On examining again the digital example given with reference to FIG. 1, it will be observed that with the circuitry shown in FIG. 4, to obtain, at the output of counter 15, a digital number proportional to the frequency of the input signal with fluctuations of ± 1 bit at 40 Hz, it is sufficient to make Q1 = Q2 = 13 and N1 = N2 = 8, this giving $\tau$  8 ms and z = 1.

These figures show that using the filter of the second order illustrated in FIG. 4 makes it possible to obtain greater pass bands for equal fluctuations than with a filter of the first order illustrated in to FIG. 1.

The cut off frequency of the second order filter is 20 Hz.

Figure 5:
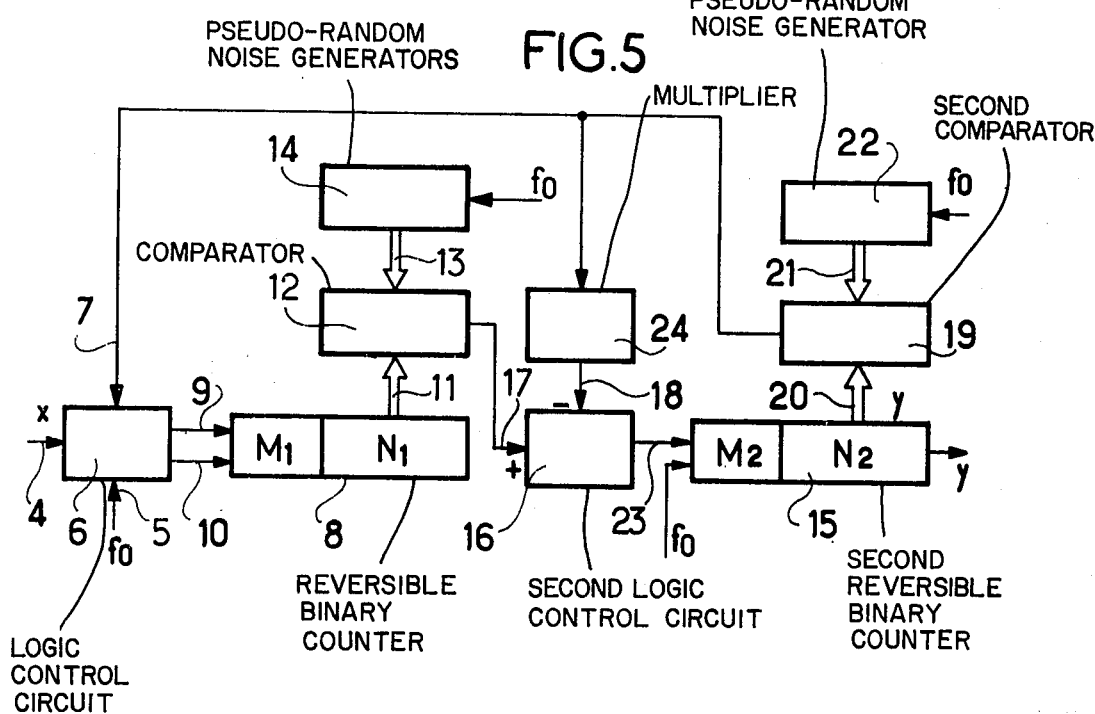

FIG. 5 shows another circuit whose transfer function is also that of a filter of the second order, but which makes it possible to obtain damping coefficients lower than 1.

In this circuit, the elements of the circuitry shown in FIG. 4 are found again. The number required is also the contents of the last N2 stages of counter 15, except that, on the input 7 of the logic control circuit 6 is the stochastic signal output of comparator 19. This signal is the stochastic signal representing the contents of reversible counter 15. It is possible to connect an element 24 having a gain K less than 1 in the loop of counter 15. A gain element may also be inserted in the loop of counter 8. The inserting of the gain K may, for example, be effected by means of stochastic multipliers.

With the same notation used previously, the transfer function of the FIG. 5 circuitry is:

$$y/x = \frac{1}{1 + \tau_1 P + \tau_1 \cdot \tau_2 P^2}$$

and the result deduced therefrom is:

$$\tau = \sqrt{\tau_1 \cdot \tau_2} = 2 \frac{Q_1 + Q_2}{2} \cdot T_0$$

$$z = \frac{1}{2} \sqrt{\frac{\tau_1}{\tau_2}} = \frac{1}{2} \cdot 2^{\frac{Q_1 - Q_2}{2}}$$

It will be observed that the damping coefficient z varies only in a discontinuous way, with a step equal to $\sqrt{2}$, as a function of $Q_1$ and $Q_2$. If $Q_1 = Q_2$, z = 1/2; if $Q_1 = Q_2$, z = $\sqrt{2/2}$; if $Q_1 = 4 Q_2$, z = 1.

If the input data into the frequency-to-number converter translates the rotational speed of a mechanical element, it is often interesting to know the acceleration of that mechanical element, that is, to know the derivation in relation to the time of the input signal.

It is known that an estimation method in the first order of the derivative B of a function g(t) is that which is written:

$$B = \frac{g(t) - g(t - \Delta t)}{t}$$

, when $g(t - \Delta t)$ is the value of the function g at the instant $(t - \Delta t)$ where $\Delta t$ = a constant time.

Figure 6:
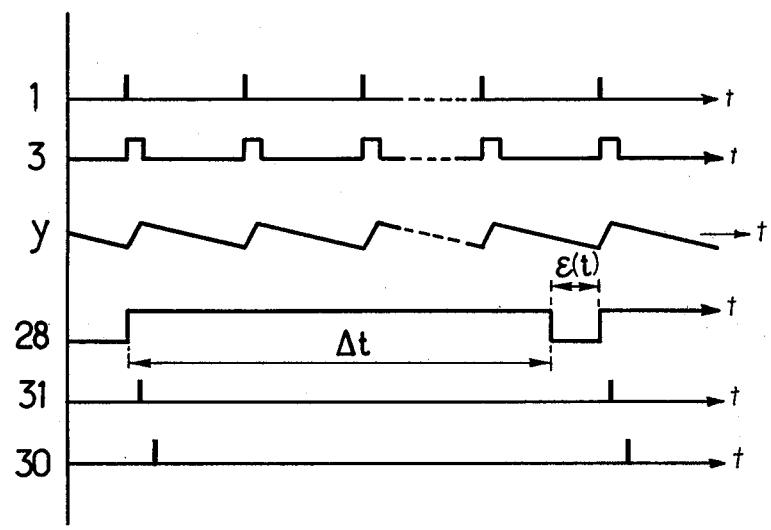
FIG. 6 shows the signals used in a circuit enabling, moreover, the obtaining of the derivation in relation to the time of the input signal.

But with the type of frequency-to-number converter used according to the present invention (filter of the first or second order) is appears that the number y obtained at the output of the convertor is flawed with fluctuations which have a frequency to that of the input signal, as shown in FIG. 6.

It is thus seen that, if the difference is made between the value of g at a random instant t and the value of g at the instant $(t - \Delta t)$, it is possible, according to the instant t chosen, to obtain, for a constant input signal, a number other than zero and the value of that number may reach the difference from crest to crest of the fluctuations of the number representing the frequency of the input signal therein.

Therefore, B is not measured on a time constant $\Delta t$, but on a time $t_1 = \Delta t + \epsilon (t)$, such that $t_1$ be equal to a whole number of periods of the input signal.

Several methods may be implemented to apply that measuring method.

The invention provides more particularly a method characterized in that the said first logic control circuit drives a third reversible counter in the same way as it drives the first reversible counter. This third counter is followed by a memory and a synchronization circuit provides two series of pulses, the pulses of each series having a phase difference equal to an integral number of periods from that of the input signal, with the pulses of the first series being staggered in delay in relation to the pulses of the second series by at least one clock period. The pulses of the first series are used to trigger the resetting to zero of the third reversible counter whereas the pulses of the second series are used to trigger the storage the memory of the contents of the third counter, so that it is possible to sample in the memory a number representing the derivative of the input signal with respect to time.

Figure 7:
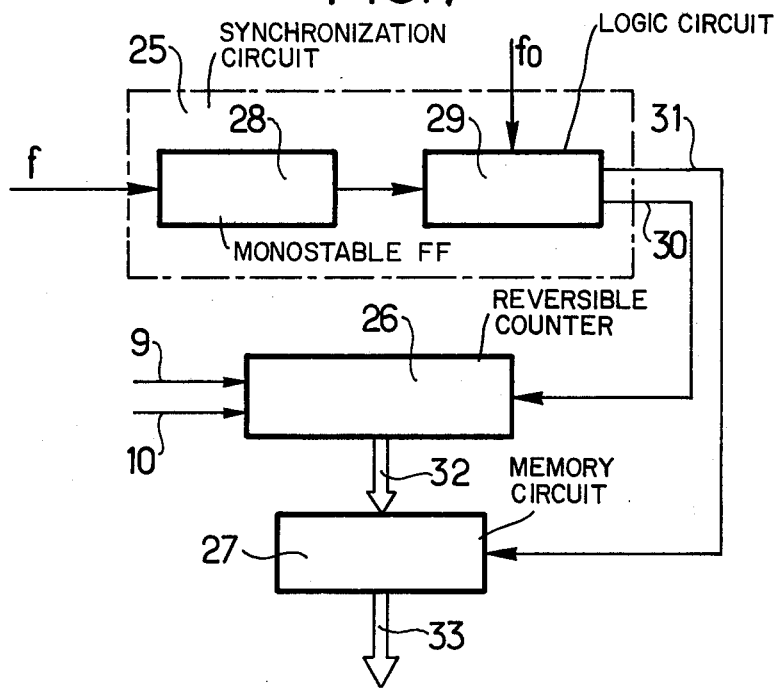
FIG. 7 shows the diagram of an additional circuit giving that derivation.

FIG. 7 shows a circuitry enabling the implementing of that method.

That circuitry is composed essentially of a synchronization circuit 25, a reversible counter 26 which has been previously designated as the third reversible counter and a memory 27.

The circuit 25 comprises a monostable flip-flop 28 circuit 29. The monostable flip-flop 28 receives the input signal at the frequency f with the first pulse received triggering the monostable flip-flop. The flip-flop latter holds remains in its triggered state for a predetermined time period $\Delta t$. At the end of time period t, the flip-flop 28 resets and is again triggered by the following pulse. At the end of a pulse of width $\epsilon (t)$, as shown in FIG. 6, the sum $\Delta t + \epsilon (t)$, is equal to the period of the output signal of flip-flop 28, which has been previously defined as time period $T_1$. The circuit 29 receives the signal output of flip-flop 28 as well as the clock pulses at the frequency $f_0$. It emits at 30 a first series of pulses and, at 31, a second series of pulses. These pulses are constituted, for the second series, by each first clock pulse and, for the first series, by each second clock pulse following the beginning of a gating pulse, having a width t, of the output of monostable flip-flop 28, as shown in FIG. 6.

The Counter 26 which is driven by the inputs 9 and 10 as shown previously with regard to counter 8, is reset to zero at each pulse of the series of pulses 30. The memory circuit 27 receives, at 32, the logic state of counter 26 and at input 31 receives the pulses used as the memory store command signals. Thus, the difference in value of the input signal between two instants separated by an interval $t_1$, is obtained at the output 33 of that memory.

If the preceding notations are used again, the measurement m which is made may be expressed in the form: $m = g(t) - g(t-t1)$, or if $\epsilon(t)$ is very small with respect to $\Delta t$ $$m = B \cdot \left(1 + \frac{\epsilon(t)}{\Delta t}\right) \cdot \Delta t$$

which is effectively an estimation of the derivative required.

$\epsilon(t)$ must be sufficiently small with respect to the time $\Delta t$, this meaning that the time of each measurement must be great before the lowest of the frequencies are passed. It will be observed, in FIG. 6, that the variation of that function g is measured at the end of a whole number of periods of the input signal and more precisely, between two low points of the "number" signal the variation is zero for a constant input to the frequency-to-number converter.

Figure 8:
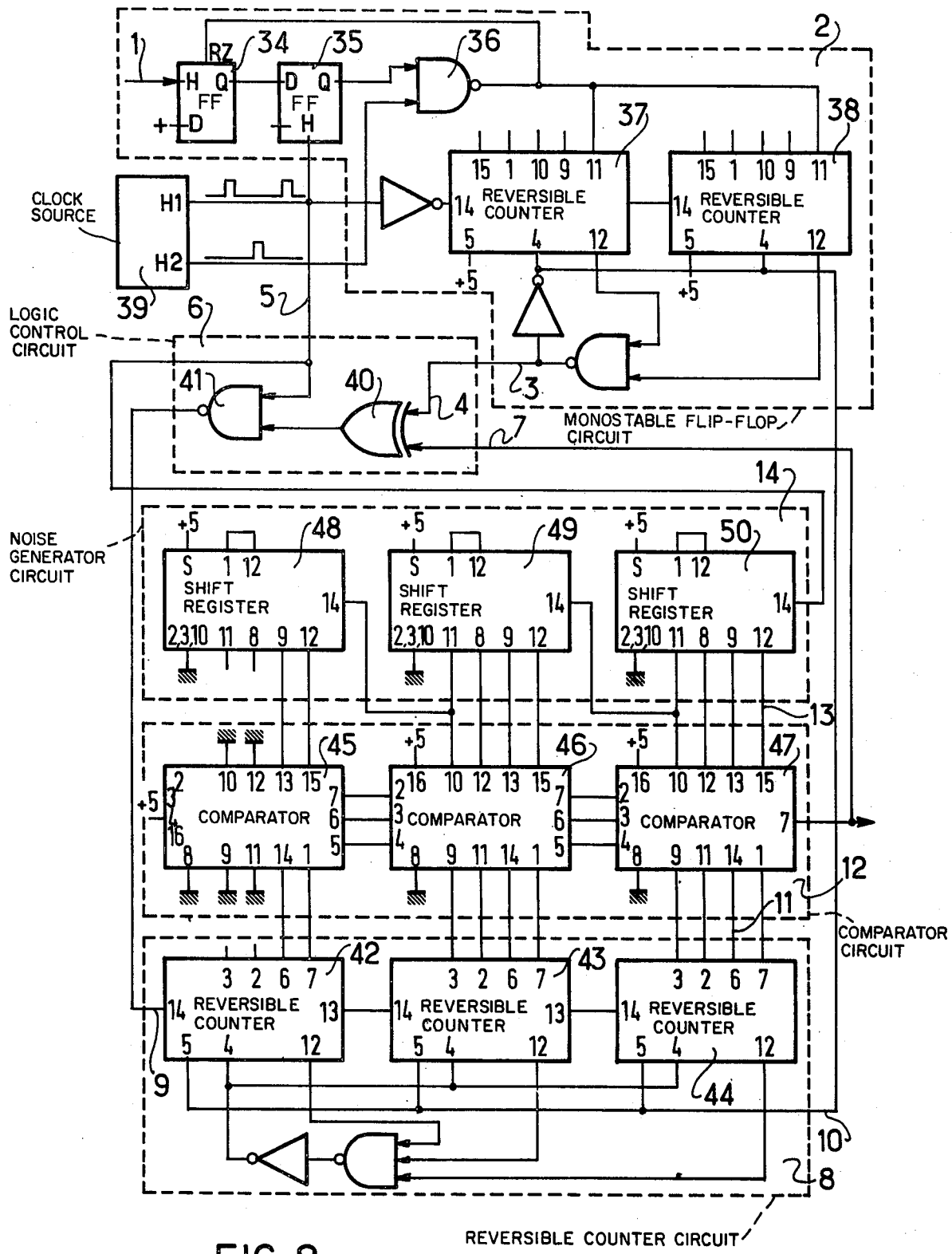
FIG. 8 shows a technological embodiment of the diagram in FIG. 1.

In FIG. 8, which shows one of the possible technological embodiments of the diagram in FIG. 1, all the elements of that latter figure are found again and, moreover, the internal constitution of the assemblies shown by simple rectangles in FIG. 1 has been illustrated.

The monostable flip-flop 2 consists of a memory formed by two flip-flops 34 and 35 which may be the flip-flops sold by Texas Instruments under the reference 7474 and by a NAND gate 36 and by a reversible counter constituted by two integrated circuits 37 and 38 such as the I.C.'s of the type 74191 made by Texas Instruments, for example. The counter is driven by a clock 39 which is a conventional type quartz oscillator supplying at its two outputs two pulse signals staggered in relation to each other. The width of the pulses obtained at the output 3 of monostable flip-flop 2 may be adjusted by modifying the preset inputs of the reversible counter formed by the I.C's 37 and 38.

The logic control circuit 6 is composed of an "EXCLUSIVE OR" circuit 40 and a "NAND" gate 41 and it emits at 9 pulses sent into the reversible counter 8 consisting of twelve flip-flops distributed among three I.C.'s 42, 43 and 44 of the 74191 type, for example. Ten of these twelve flip-flops are used for stochastic coding and two of them are used as buffer stages.

The outputs of these ten flip-flops of reversible counter 8 are connected to ten inputs of the comparator 12 consisting of 4-bit comparator circuits distributed among three I.C.'s 45, 46, 47 of the Texas Instruments 7485 type, for example. The ten other corresponding inputs of the comparator 12 are connected to ten outputs of the noise generator 14 consisting of flip-flops distributed among three I.C's 48, 49, 50 of the Texas Instruments 7493 type, for example.

It is easy to produce, with reference to the diagram in FIG. 8, the filters of the second order of the diagrams in FIGS. 4 and 5.

FIG. 9 shows one of the possible technological embodiments of the diagram in FIG. 7. All the elements in FIG. 7 may be found again therein.

The monostable flip-flop 28 comprises a flip-flop 51 of the Texas Instruments 74123 type, for example. The circuit 29 is composed of a set of flip-flops 52, 53, 54 of type 7474, for example. The reversible counter 26 is formed of two I.C.'s 55 and 56, of type 74191, for example, having four flip-flops each. Likewise, the memory 27 consists of two housings I.C's 57 and 58 of the Texas Instruments 74175 type, for example, having four flip-flops each.

We claim:
1. A conversion method for obtaining a number representing the frequency of a frequential input signal wherein said frequential input signal is in the form of a series of pulses, each having a pulse width a comprising the steps of:
   generating at least a first stochastic signal; and
   controlling at least a first counting operation in response to the frequential input signal and said first stochastic signal such that clock pulses, generated by a clock pulse generator, which are counted by said first counting operation are counted up during the time period a when said frequential input signals are present and counted down at all other times, whereby the number resulting from the first counting operation is utilized for generating the first stochastic signal and wherein said first stochastic signal is a coding in a stochastic representation form of the number representing the frequency of said frequential input.

2. A conversion method according to claim 1, wherein the step of generating at least a first stochastic signal includes the step of coding the result of the first counting operation to generate the first stochastic signal.

3. A conversion method according to claim 2, wherein the number resulting from the first counting operation is the number representing the frequency of said frequential input signal.

4. A conversion method according to claim 2, further comprising the steps of:
   generating a second stochastic signal, and
   controlling a second counting operation in response to the first stochastic signal and the second stochastic signal wherein the second stochastic signal is the coding in a stochastic representation form of the result of the second counting operation such that in said second counting operation the clock pulses are counted up or down respectively depending on whether said first stochastic signal is, on the average, larger or smaller than said second stochastic signal, whereby the number representing the frequency of said frequential input signal is the result of a second counting operation.

5. A conversion method according to claim 1, wherein a second stochastic signal is the coding in a stochastic representation form of a second counting operation, and
   controlling the second counting operation in response to the first and second stochastic signals such that, in said second counting operation, clock pulses are counted up or down respectively depending on whether said second stochastic signal is, on the average, larger or smaller than said first stochastic signal, whereby said number representing the frequency of said frequential input signal is the result of said second counting operation.

6. A conversion method according to claim 1, further comprising the steps of performing an additional counting operation such that the count of the additional counting operation returns to zero at times defined by a first series of pulses whose phase differs from the frequential input signal by an integral number of periods of the frequential input signal, storing the number resulting from said additional counting operation at a time defined by a second series of pulses, the first series of pulses being delayed with respect to said second series of pulses by an integral number of periods of said input signal, the difference between successive numbers of said stored additional counting operation representing the derivative with respect to time of the input signal.

7. A conversion apparatus for generating a number of representing the frequency of a frequential input signal wherein said frequential input signal is in the form of a series of pulses, each having a pulse width $a$, comprising:
 at least a first counting means for performing at least a first counting operation; and
 at least a first regulating means for regulating said first counting means,
 said first regulating means including at least a first signal generating means for generating at least a first stochastic signal which is a coding in a stochastic representation form of the number representing the frequency of said frequential input signal and at least a first control means responsive to the output of said first signal generating means and the frequential input signal for controlling the first counting means such that clock pulses, generated by a clock pulse generator, which are counted by the first counting means are counted up during the time period $a$ when said frequential input pulses are present and counted down at all other times, said first counting means providing an output indicative of the count thereof, whereby the output of the first counting means is utilized for generating a first stochastic signal.

8. A conversion apparatus according to claim 7, wherein said first signal generating means includes means for coding the output of the first counting means to generate the first stochastic signal.

9. A conversion apparatus according to claim 8, wherein the output of the first counting means is the number representing the frequency of said frequential input signal.

10. A conversion apparatus according to claim 8, further comprising:
 second counting means for performing a second counting operation;
 second signal means for generating a second stochastic signal which is the coding in a stochastic representation form of the output of said second counting means; and
 second control means for controlling the second counting means in response to the first stochastic signal and the second stochastic signal such that in the second counting means the clock pulses are counted up or down respectively depending on whether said first stochastic signal is, on the average, larger or smaller than said second stochastic signal, said second counting means providing an output indicative of the count thereof, whereby the number representing the frequency of said frequency input signal is the output of said second counting means.

11. A conversion apparatus according to claim 7, further comprising:
 second counting means for performing a second counting operation and providing an output indicative of the count thereof, said first signal generating means generating the first stochastic signal which is the coding in a stochastic representation form of the output of the second counting means, second signal generating means for generating a second stochastic signal which is the coding in a stochastic representation form of the output of the first counting means, second control means for controlling the second counting operation in response to the first and second stochastic signals such that in the second counting means, clock pulses are counted up or down respectively depending on whether said second stochastic signal is, on the average, larger or smaller than said first stochastic signal.

12. A conversion apparatus according to claim 7, further comprising an additional counting means for receiving an output of said first control means, said additional counting means returning the count thereof to zero at times defined by a first series of pulses whose phase differs from the frequential input signal by an integral number of periods of the frequential input signal, storing means for storing the results of said additional counting means at a time defined by a second series of pulses, the first series of pulses being delayed with respect to said second series of pulses by an integral number of periods of said input signal, the difference between successive numbers stored in said additional counting means representing the derivative with respect to time of the input signal.

* * * * *